United States Patent [19]

Nakamoto

[11] 4,039,359
[45] Aug. 2, 1977

[54] METHOD OF MANUFACTURING A FLATTENED SEMICONDUCTOR DEVICE

[75] Inventor: Nobuyuki Nakamoto, Tokyo, Japan

[73] Assignee: Hitachi, Ltd., Japan

[21] Appl. No.: 731,340

[22] Filed: Oct. 12, 1976

[30] Foreign Application Priority Data

Oct. 11, 1975  Japan ................................ 50-121833

[51] Int. Cl.² ............................................ H01L 21/225
[52] U.S. Cl. ...................................... 148/188; 148/1.5; 148/187; 427/85; 357/49
[58] Field of Search ........................ 148/188, 1.5, 187; 427/85; 357/49

[56] References Cited

U.S. PATENT DOCUMENTS

| | | | |
|---|---|---|---|
| 3,660,156 | 5/1972 | Schmidt | 148/188 |
| 3,832,246 | 8/1974 | Lynch | 148/175 |
| 3,900,350 | 8/1975 | Appels et al. | 148/187 X |
| 3,958,040 | 5/1976 | Webb | 427/94 |
| 3,961,999 | 6/1976 | Antipov | 29/578 X |
| 4,001,465 | 1/1977 | Graul et al. | 148/187 |
| 4,002,511 | 1/1977 | Magdo et al. | 148/1.5 X |
| Re. 28,653 | 12/1975 | Murphy | 148/175 |

*Primary Examiner*—G. Ozaki
*Attorney, Agent, or Firm*—Craig & Antonelli

[57] ABSTRACT

A method of manufacturing a semiconductor device whose surface is flattened, comprises the steps of forming a first semiconductor oxide film at selected areas of a surface of a semiconductor substrate by local oxidation, applying a solution of a semiconductor compound onto the surface of the resultant substrate, the solution being adapted to form a second semiconductor oxide film whose etching rate is substantially equal to that of the underlying first semiconductor oxide film, vaporizing a solvent of the solution so as to form the second semiconductor oxide film on the substrate surface, and etching parts of the first and second semiconductor oxide films.

11 Claims, 13 Drawing Figures

METHOD OF MANUFACTURING A FLATTENED SEMICONDUCTOR DEVICE

BACKGROUND OF THE INVENTION

1. Field of the Invention

This invention relates to a method of manufacturing a semiconductor device, and more particularly to a method of manufacturing a semiconductor device within a semiconductor substrate having uneven surface portions.

2. Description of the Prior Art

In a semiconductor integrated circuit (hereinbelow, termed "IC"), a large number of circuit elements such as transistors, diodes and resistances are formed within a common semiconductor substrate. The respective circuit elements must be electrically isolated by isolation regions. The formation of the isolation regions is generally carried out by a diffusion process.

In order to enchance the density of integration in the IC, the number of accommodated circuit elements per unit area must be made large. To this end, it is necessary to reduce the area of the isolation region occupying a considerable space in the circuit element. However, where the isolation region is formed by diffusion as stated above, it is difficult to reduce the area thereof to below a certain fixed value. It has, therefore, been desired to reduce the occupying area by any method.

In order to eliminate the disadvantage described above, there has been proposed a method wherein the isolation is effected with an insulator which replaces the diffused region. According to this method, a region within a semiconductor substrate prearranged for isolation is formed with a semiconductor oxide film by applying a local oxidation technique. The oxide film is utilized as the insulator, and is capable of reducing the occupying area by 40 – 50 % in comparison with a diffused region. The local oxidation technique is described in detail in, for example, "Philips Research Report," pages 118 through 132 issued by Philips Reseach Laboratory in April 1970.

FIGS. 1(A) and 1(B) illustrate an example in the case of manufacturing an IC by applying a local oxidation technique as explained above, and show only one circuit element. First, as shown in FIG. 1(A), an N conductivity type silicon substrate 1 is prepared, and a film 2 of, for example, silicon nitride ($Si_3 N_4$) is formed on a desired area of the surface of the substrate 1 as an oxidation resisting film. As a method of forming the $Si_3 N_4$ film 2, there can be applied a known method which exploits the vapor phase reaction between, for example, monosilance ($SiH_4$) and ammonia ($NH_3$). It is preferred that a thin $SiO_2$ layer is formed on the surface of the substrate prior to the vapor phase reaction so as to prevent the substrate surface from becoming rough. The film 2 being about 1,300 A thick can be formed only at the desired area in such a way that, after forming the $Si_3 N_4$ film over the entire area of the surface of the substrate 1, it is subjected to the selective etching within an etchant such as heated phosphoric acid ($H_3 PO_4$). Thereafter, using the film 2 as a mask, the substrate is somewhat etched. The amount of etching is to such an extent that $SiO_2$ is prevented from protruding beyond the substrate surface on acound of a volumetric increase due to oxidation processing to be subsequently carried out.

As illustrated in FIG. 1(B), the resultant substrate 1 is heat-treated during exposure to an oxidizing atmosphere, to locally oxidize that area of the substrate surface on which the film 2 does not exist. By way of example, the heat treatment is carried out at 1,000° C for 16 hours, whereby a silicon oxide ($SiO_2$) film 3 having a thickness of about 18,000 A can be produced. Subsequently, the film 2 is removed and the exposed part of the substrate 1 is doped with a necessary impurity by an expedient such as diffusion and ion implantation. Thus, the desired circuit element is formed. The figure exemplifies a case of forming a transistor, in which numeral 4 designates an emitter region, numeral 5 a base region and numeral 6 a collector region. Shown at 7 is a protective ($SiO_2$) film which is formed on the surface of the substrate.

Numeral 8 indicates an emitter electrode and numeral 9 a base electrode, and these electrodes are formed by photoetching the protective film 7 and thereafter depositing aluminum or the like. The silicon oxide film 3 functions as the isolation region for insulation among the circuit elements.

When an IC, applying the local oxidation technique as stated above, is observed, it is noted that a conspicuous protuberance is formed especially at the upper end part of the silicon oxide film 3 produced by the local oxidation. The protuberance is usually called a "bird head" or "bird beak." The existence of the protuberance incurs many problems such that the electrode wirings 8 and 9 formed thereon are prone to be disconnected and that the close contact with a mask pattern for a photolithographic processing is rendered imperfect.

SUMMARY OF THE INVENTION

This invention has been made in order to eliminate the various problems attributed to the uneven parts of the surface of a substrate, such as the bird beak.

An object of this invention is to provide a technique for flattening the uneven surface of a substrate.

Another object of this invention is to provide a novel method of manufacturing a semiconductor device wherein circuit element regions are formed simultaneously with a processing for removing the uneven parts of the surface.

This invention consists in a method of manufacturing a semiconductor device comprising the steps of forming an oxidation resisting film on a desired area of a surface of a semiconductor substrate, forming a first semiconductor oxide film by oxidizing that area of the substrate surface which is other than the desired area, applying a solution of a semiconductor compound or a solution of a semiconductor compound containing a desired impurity onto the substrate surface formed with the first semiconductor oxide film, vaporizing a solvent of the solution and forming a second semiconductor oxide film on the substrate surface, and removing parts of said first semiconductor oxide film and the second semiconductor oxide film.

DETAILED DESCRIPTION

Embodiment 1

Referring to FIGS. 2(A) to 2(F), a first embodiment of this invention will be described.

Figure 1A:
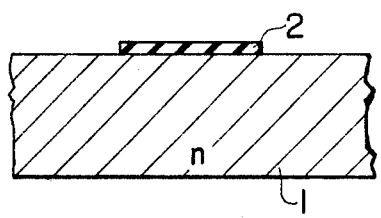
FIGS. 1(A) and 1(B) are sectional views showing steps of a prior-art method of manufacture.
Figure 1B:
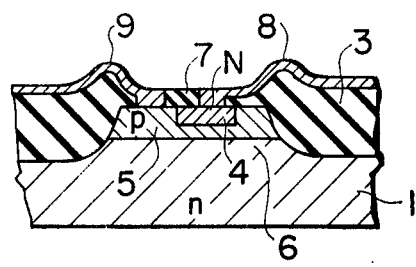
Figure 2A:
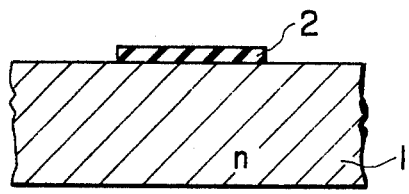
FIGS. 2(A) and 2(F) are sectional views showing an embodiment of this invention in the order of steps carried out.

Step (A), FIG. 2(A): An N-type silicon substrate 1 is prepared, and its surface is partially provided with a silicon nitride film 2 by the method explained previously. If necessary, the surface portion of the silicon substrate may be somewhat etched by employing the silicon nitride film 2 as a mask.

Figure 2B:
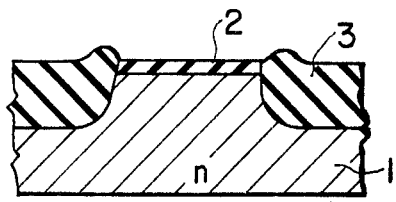

Step B, FIG. 2(B): The silicon substrate 1 is heat-treated during exposure to an oxidizing atmosphere. Thus, the substrate surface not covered with the silicon nitride film 2 is locally oxidized and provided with an oxide film 3. Oxidizing conditions can be selected as described previously.

Figure 2C:
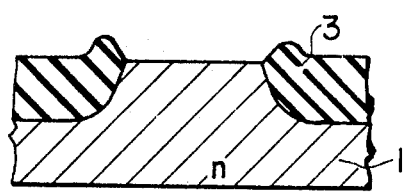

Step C, FIG. 2(C): The resultant substrate 1 is immersed in an etchant such as phosphoric acid ($H_3PO_4$), to remove the silicon nitride film 2.

Figure 2D:
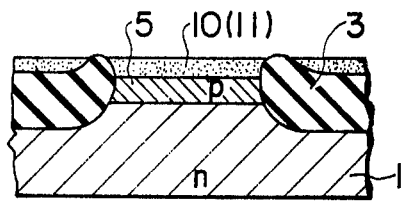

Step (D), FIG. 2(D): A solution 10 is prepared which is obtained by, for example, adding 2.5 gm of a boron compound to 100 gm of an alcohol solution of a silicon compound containing 6 % of $SiO_2$. It is applied onto the surface of the silicon substrate 1 which is rotated at 3,000 r.p.m.

Since the solution 10 is applied more to a concave part of the surface of the substrate 1, the top side of the substrate becomes considerably flatter than before the application of the solution. Where the concave part is considerably large, the solution is applied more at a stepped part, and the step is smoothed. The substrate 1 is subsequently head-treated at 200° C. for 30 minutes, to vaporize the alcohol in the solution 10. Further, the substrate 1 is heat-treated at a temperature of about 1,100° C. for 30 minutes. Thus, the solution 10 is converted into a semiconductor oxide ($SiO_2$) film 11, and simultaneously therewith, an impurity (boron) in the solution 10 is diffused into the substrate 1 so that a P-type region 5 of about 2–3$\mu$is formed. The semiconductor oxide film 11 thus formed exhibits characteristics equal to those of the oxide film 3 having been already formed, and substantially equal etching speeds are exhibited for a common etchant.

Figure 2E:
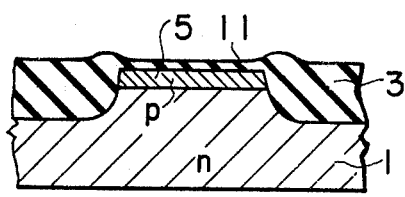

Step E, FIG. 2(E): The resultant substrate 1 is immersed in an etchant, for example, a mixed solution consisting of hydrofluoric acid (HF) and water ($H_2O$) (at a volumetric ratio of 1 : 4 ), and for about 7 minutes. Thus, the protuberances of the oxide films 3 and 11 are gradually etched. As a result, an oxide film flattened over its entire area is obtained.

According to the present method, the step height of the protuberance measured to be about 0.6$\mu$ with the prior art can be reduced down to about 0.2$\mu$.

Figure 2F:
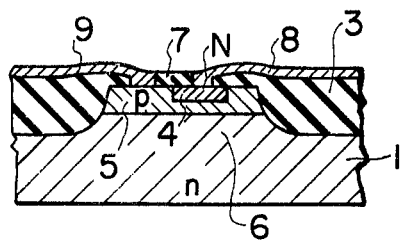

Step F, FIG. 2(F): The oxide film 11 on the P-type region 5 is partially removed, and phosphorus is diffused through the opened part, to form an N-type region 4. Subsequently a thin film of a metal such as aluminum is deposited onto the surface of the substrate, to form necessary electrode wiring. Thus, an N-P-N transistor is completed. The region 4 serves as an emitter region, the region 5 as a base region, a region 6 as a collector region, the film 8 as an emitter electrode, and the film 9 as a base electrode. A collector electrode is led out from another surface part not shown. Numeral 7 designates the oxide film 11 left behind.

Where a diffused region of a sufficient depth is not produced by the heat treatment in the step (D), a heat treatment can be performed again after the step (E)so as to further promote diffusion.

Embodiment 2

Referring now to FIGS. 3(A) to 3(E), another embodiment of this invention will be described.

Figure 3A:
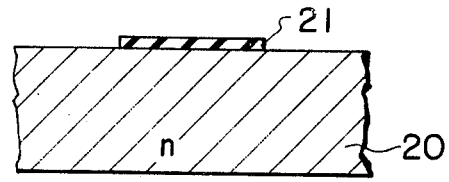
FIGS. 3(A) to 3(E) are sectional views showing another embodiment of this invention in the order of steps carried out.

Step (A), FIG. 3(A): An N-type silicon substrate 20 is prepared, and its surface is partially formed with a silicon nitride film 21. Using the silicon nitride film 21 as a mask, the surface portion of the silicon substrate is somewhat etched.

Figure 3B:
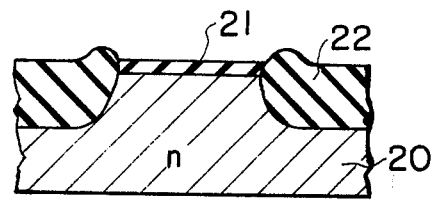

Step (B), FIG. 3(B): The substrate 20 is heat-treated during exposure to an oxidizing atmosphere. Thus, the substrate surface not covered with the silicon nitride film 21 is locally oxidized and provided with an oxide film 22. Conditions in both the above steps are the same as in the prior art.

Figure 3C:
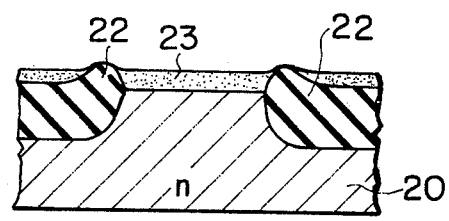

Step (C), FIG. 3(C): The silicon nitride film 21 is removed. Thereafter, a solution 23 in which a silicon compound, for example, O. C. D. (trade name of a coat composite produced by Tokyo Oka Kabushiki-Kaisha in Japan) is dissolved in alcohol is prepared, and it is applied onto the surface of the silicon substrate 20 which is rotating at 1,000 r.p.m.

Since the solution 23 is applied more to a concave part of the surface of the substrate 20, the top side of the substrate becomes considerably flatter than before the application of the solution. Where the concave part is considerably large, the solution is applied more at a stepped part, and the step is smoothed. The substrate 20 is subsequently heat-treated at a temperature of about 200° C. for 30 minutes, to vaporize the alcohol in the solution 23. Further, the substrate is heat-treated at a temperature of about 1,100° C. for 30 minutes. By this heat treatment, the solution is converted into a semiconductor oxide ($SiO_2$) film 24, which remains on the substrate surface.

The thickness of the solution 23 is selected 23 according to the degree of the protuberances of the oxide film 22 to be removed. By way of example, the solution is applied to a thickness of 6,000 – 7,000 A, and it is connected into an oxide film having a thickness of 6,000 – 7,000 A after the heat treatment. The oxide film 24 thus obtained exhibits characteristics equal to those of the oxide film 22 selectively formed, and both oxide films have substantially equal etching speeds for an etchant to be described below.

Figure 3D:
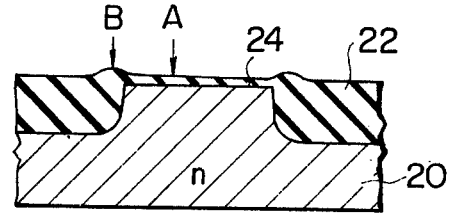

Step D, FIG. 3(D): The substrate 20 which includes the oxide film 22 formed by the local oxidation and the oxide film 24 formed by the application process is subjected to etching for about 7 minutes by immersing it in an etchant, for example, a mixed solution which consists of hydrofluoric acid (HF) and water ($H_2O$) (at a volumetric ratio of 1 : 4 ). Thus, the protuberances 22 and 24 of the oxide films are gradually etched, and an oxide film which is about 2,000 – 3,000 A thick (at a part A) and which is flattened over its entire area is obtained.

According to the present method, the step (a part B) of the protuberance measured at about 0.6$\mu$with the prior art can be reduced to about 0.2$\mu$.

Figure 3E:
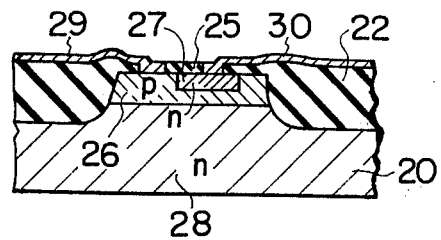

Step (E), FIG. 3(E): In order to form a required circuit element within the substrate, the oxide film is removed at necessary parts, and the substrate is doped with impurities by diffusion. Subsequently, a thin film of a metal such as aluminum is deposited onto the surface of the substrate, to form necessary electrode wirings.

FIG. 3(E) illustrates a case of forming a transistor in which numeral 26 designates a base region, numeral 27 an emitter region, numeral 28 a collector region, numeral 29 a base electrode, and numeral 30 an emitter electrode. A collector electrode is led out from another surface part not shown.

As is apparent from the above explanation, according to the manufacturing method of this invention, a solution which contains a semiconductor compound adapted to become a desired semiconductor oxide film after a necessary heat-treatment and which also contains a desired impurity is applied onto the surface of a semiconductor substtate having uneven parts after local oxidation, and a heat treatment is subsequently carried out, whereby it is possible to convert the solution into the semiconductor oxide film and to simultaneously diffuse a desired impurity into the substrate. Further, an etching processing is thereafter carried out, whereby protuberant parts of the oxide film can be removed, so that an extraordinarily flattened surface portion is obtained. In particular, according to the manufacturing method, the diffusion of the impurity can be effected simultaneously with the formation of the semiconductor oxide film, and the diffusion step can advantageously be omitted to that extent.

The semiconductor oxide film formed from the solution by the application process is very close in points of characteristics, such as etching rate and density, to the semiconductor oxide film previously formed on the substrate surface by local oxidation, so that the former proves no hindrance to the subsequent steps to etching, diffusion, etc.

The step of applying the solution may be divided and carried out several times. This method is effective especially in the case of applying a thick solution. The solutions applied in the embodiments as have been specifically described are those which can form the film of the same composition as that of the underlying semiconductor oxide film. However, the invention is not restricted to the specified materials, but any material can be similarly used insofar as it can form a film which is etched by an etchant for the underlying semiconductor oxide film although it differs in composition from the underlying film and whose etching rate is approximately equal to that of the underlying film.

According to the invention, the stepped parts of the bird heads or bird beaks in the oxide film formed by local oxidation are remarkably reduced, so that the problem of the disconnection of the electrode wiring and the problem of the imperfect contact with a mask pattern in a photolithographic processing can be solved. Also, since one diffusion step can be omitted, the invention serves for the reduction of the number of steps.

This invention is greatly effective especially when applied to the manufacture of ICs. It is a matter of course that circuit elements to be formed within the substrate may be for any purpose.

While I have shown and described two embodiments in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

I claim:

1. A method of manufacturing a semiconductor device, comprising the steps of:

a. preparing a substrate which has an uneven surface,
   b. applying onto the surface of said substrate a solution capable of being converted into a film by a heat-treatment, so that the film will cover concave parts of the substrate surface, said film exhibiting an etching rate to the same extent as that of an underlying layer,
   c. converting said solution into said film by said heat-treatment, and
   d. etching at least a part of said film and at least a part of said underlying layer.

2. A method of manufacturing a semiconductor device according to claim 1, wherein said solution capable of forming a film exhibiting an etching rate to the same extent as that of an underlying layer is a solution of a semiconductor compound.

3. A method of manufacturing a semiconductor device according to claim 2, wherein said solution of a semiconductor compound is an alcoholic solution of a silicon compound.

4. A method of manufacturing a semiconductor device according to claim 1, wherein step (c) comprises heating said solution to such an extent to cause the removal of a component of said solution and to form said film on the surface of said substrate.

5. A method of manufacturing a semiconductor device according to claim 4, wherein said solution is an alcoholic solution of a semiconductor compound.

6. A method of manufacturing a semiconductor device according to claim 4, wherein said substrate is a semiconductor substate, said solution contains an impurity of a prescribed conductivity type, and step (c) comprises heating said solution to such an extent to cause the diffusion of said prescribed impurity into said semiconductor substrate.

7. A method of manufacturing a semiconductor device, comprising the steps of:

a. preparing a substrate which has an uneven surface,
   b. applying onto the surface of said substrate a solution, containing a prescribed impurity, capable of being converted into a film by a heat-treatment, so that the film will cover concave parts of the substrate surface, said film exhibiting an etching rate to the same extent as that of an underlying layer,
   c. converting said solution into said film by said heat-treatment, and
   d. etching at least a part of said film and at least a part of said underlying layer.

8. A method of manufacturing a semiconductor device according to claim 7, wherein said solution containing a desired impurity capable of forming a film exhibiting an etching rate to the same extent as that of an underlying layer is a solution of a semiconductor compound containing said prescribed impurity.

9. A method of manufacturing a semiconductor device according to claim 8, wherein said solution of a semicondcutor compound containing said prescribed impurity is an alcoholic solution of a silicon compound containing a prescribed impurity.

10. A method of manufacturing a semiconductor device, comprising the steps of:

a. forming an oxidation resisting film on selected parts of a surface of a semiconductor substrate,
    b. oxidizing the substrate surface, other than said selected parts, to form a first semiconductor oxide film, c. applying a solution of a semiconductor compound onto said substrate surface formed with said first semiconductor oxide film, d. vaporizing a solvent of said solution, to form a second semiconductor oxide film on the substrate surface, and e. removing at least a part of said first semiconductor oxide film and at least a part of said second semiconductor oxide film from the surface of said substrate.

11. A method of manufacturing a semiconductor device, comprising the steps of:

a. forming an oxidation resisting film on selected parts of a surface of a semiconductor substrate, b. oxidizing the substrate surface, other than said selected parts, to form a first semiconductor oxide film, c. applying a solution of a semiconductor compound containing a prescribed impurity onto said substrate surface formed with said first semiconductor oxide film, d. vaporizing a solvent of said solution so as to form a second semiconductor oxide film on the substrate surface, and simultaneously diffusing said prescribed impurity into said substrate, and e. removing at least a part of said first semiconductor oxide film and at least a part of said second semiconductor oxide film from the surface of said substrate.

* * * * *